United States Patent [19]
Wynne et al.

[11] Patent Number: 5,835,453
[45] Date of Patent: Nov. 10, 1998

[54] ELECTROSTRICTIVE ACOUSTIC PROJECTOR AND POLYMERS USED THEREIN

[75] Inventors: Kenneth J. Wynne, Fairfax County, Va.; Robert B. Fox, Bethesda, Md.; Alan W. Ellinthorpe, Fairfax County, Va.

[73] Assignee: The United States of America as represented by the Secretary of the Navy, Washington, D.C.

[21] Appl. No.: 851,544

[22] Filed: May 5, 1997

(Under 37 CFR 1.47)

Related U.S. Application Data

[63] Continuation-in-part of Ser. No. 93,850, Jul. 20, 1993, abandoned.

[51] Int. Cl.$^6$ ........................................ H04R 17/00
[52] U.S. Cl. .................... 367/140; 367/157; 367/163; 310/311; 29/25.35
[58] Field of Search ..................... 367/157, 163, 367/140; 310/311, 334, 800; 29/25.35

[56] References Cited

U.S. PATENT DOCUMENTS

| 3,801,839 | 4/1974 | Yo ................................................ 310/8 |
| 4,257,686 | 3/1981 | Albertinetti et al. .................... 350/360 |
| 4,933,479 | 6/1990 | Kotaka et al. ........................... 558/199 |

FOREIGN PATENT DOCUMENTS 9210916  6/1992  WIPO .

OTHER PUBLICATIONS

*Phosphonitrilic Compounds: VI. High Molecular Weight Poly(alkoxy– and aryloxyphosphanzenes)* by H.R. Allcock, R.L. Rugel and K.J. Valan. Inorganic Chemistry vol. 5, 1966 pp. 1709–1715.

*Primary Examiner*—J. Woodrow Eldred
*Attorney, Agent, or Firm*—Thomas E. McDonald; John G. Wynn

[57] ABSTRACT

Polymer materials having a low Young's modulus, a low dielectric constant, and a high apparent piezoelectric response when subjected to a high direct bias voltage and a superimposed alternating voltage, used as the active element in an underwater acoustic signal projector of a sonar system.

3 Claims, 9 Drawing Sheets

ELECTROSTRICTIVE ACOUSTIC PROJECTOR AND POLYMERS USED THEREIN

This is a c-i-p of Ser. No. 093,850 filed Jul. 20, 1993, now abn.

BACKGROUND OF THE INVENTION

1. Technical Field

The invention relates generally to electrostrictive polymers and electrostrictive acoustic devices. In particular, the invention relates to electrostrictive polymers having a low Young's modulus, a low dielectric constant, and a high apparent piezoelectric response, and to low frequency electrostrictive acoustic projectors utilizing these polymers.

2. Background Art

A sonar designed for submarine search has to radiate a very large amount of power because the natural noise that has to be overcome in undersea acoustics is several thousand times more intense than that encountered in atmospheric electromagnetics. Consequently, sonar systems use as much power as possible, limited either by the maximum power that can be furnished by the ship, or by the maximum power that can be handled by the radiators. The power radiated by existing sonar systems generally falls in the range of $10^5$ to $10^6$ watts.

Active sonar systems presently operate at a frequency of 3.5 KHz. or higher and generally utilize piezoelectric ceramics, such as lead titanate zirconate [PZT: $Pb(Zr,Ti)O_3$], as the active element of the sonar radiator.

There are many known piezoelectric polymers, such as those disclosed in U.S. Pat. No. 4,933,479 or U.S. Pat. No. 4,577,132. However, these known piezoelectric polymers have a low piezoactivity, about a factor of ten below the ceramics, and thus are generally only used in mechanical-to-electrical transducers, such as hydrophones (listening devices) where the penalty of low activity is tolerable.

It is also known that certain elastomers mixed with suitable electrically conductive fillers exhibit conspicuous electrostrictive and piezoelectric properties as long as they are biased with DC voltages. For example, U.S. Pat. No. 3,801,839 discloses a mechanical-to-electrical transducer utilizing such an electrostrictive elastomer material.

SUMMARY OF THE INVENTION

The effect of surface backscatter on an active sonar system is reduced as the acoustic operating frequency is reduced. Thus, a sonar system having an operating frequency less than 1 KHz., preferably in the range of 100 Hz to 300 Hz, is needed to minimize the effect of surface backscatter. However, as the acoustic frequency decreases, the bulk of the acoustic radiating device increases. The volume of the acoustic radiator can be minimized by matching the impedance of the acoustic radiator with the radiation impedance of water. The piezoelectric ceramics presently used in sonar transmitters, are much too stiff for optimum power radiation at very low acoustic frequencies. Even the known piezoelectric polymers are too stiff for optimum power radiation.

Thus, it is a primary object of the invention to provide an electro-acoustic polymer material having a Young's modulus which is much less than the Young's modulus of typical piezoelectric polymer materials (approximately $10^9$ Newtons per square meter), and having an apparent piezoelectric response much greater than the piezoelectric response of typical piezoelectric polymer materials (approximately 0.3 Ångströms per volt).

It is another object of the invention to provide an electrostrictive polymer having a Young's modulus less than $4 \times 10^8$ Newtons per square meter ($N/m^2$), a dielectric constant less than 10, and an apparent piezoelectric response with an electrostrictive constant greater than 3 Ångströms per volt (Å/V) when subjected to an A. C. voltage superimposed on a high D. C. bias voltage.

It is a further object of the invention to provide such a electrostrictive polymer material for use as the active element in an electrostrictive electro-mechanical transducer for generating or detecting acoustic signals.

It is a still further object of the invention to provide a process for forming such an electrostrictive polymer.

It is another object of the invention to provide an underwater sonar radiator which operates at a frequency less than 1000 Hertz and which has an electrostrictive polymer active element having a low Young's modulus, a low dielectric constant, and a high apparent piezoelectric response.

In a first embodiment of the invention, a linear polymer, poly(bis(trifluoroethoxy)phosphazene), $[(F_3CCH_2O)_2P=N]_n$, was processed to provide a polymer film having a Young's modulus of approximately $3 \times 10^8$ $N/m^2$, a dielectric constant of 6, and an electrostrictive response under high DC bias voltage greater than 3 Å/V.

This polymer has a highly hydrophobic nature, a very desirable characteristic for the active element of an underwater acoustic signal radiator, or other electromechanical transducer exposed to a humid atmosphere.

There are many polyphosphazenes, discussed below, which have similar desirable characteristics for use in underwater acoustic signal radiators.

DESCRIPTION OF PREFERRED EMBODIMENTS

In the design of an underwater sonar radiator for converting electrical energy into radiating acoustic energy, impedance matching at the two interfaces must be considered.

Viewed from the water side, the radiator should have a source impedance whose real part is small compared with the real part of the radiation impedance of the water so that the internal losses are minimized, and an imaginary part that is the negative of the imaginary part of the radiation impedance of the water so that the power transfer is maximized. Viewed from the electrical source, the radiator should present a load that has a low reactance and a resistance that is composed as purely as possible of a transformed replica of the water's radiation resistance.

The radiator considered here is a square thin slab of $PVF_2$ whose two large surfaces are each coated with an electrically conducting film which is assumed to be so thin that its mass and stiffness can be neglected. A signal voltage is applied across these electrodes, causing the $PVF_2$ to expand and contract across the thin dimension, radiating sound from the surfaces. FIGS. 4–7 show calculated results for this radiator as the following three parameters are varied: the thickness l of the slab, the length/width a of the slab, and the Young's modulus $E_m$ of the $PVF_2$.

The density of the $PVF_2$ has been assumed to be an invariant 1700 kilograms per cubic meter, a value obtained from a manufacturer's data sheet.

The mechanical losses within the $PVF_2$ have been ignored. Thus, the only real impedance included in the algebra is the resistive component of the radiation impedance.

The calculations have been specialized to a single acoustic frequency, 100 Hz. which is within a relatively narrow frequency range in which sonar activity is focussed.

Figure 1:
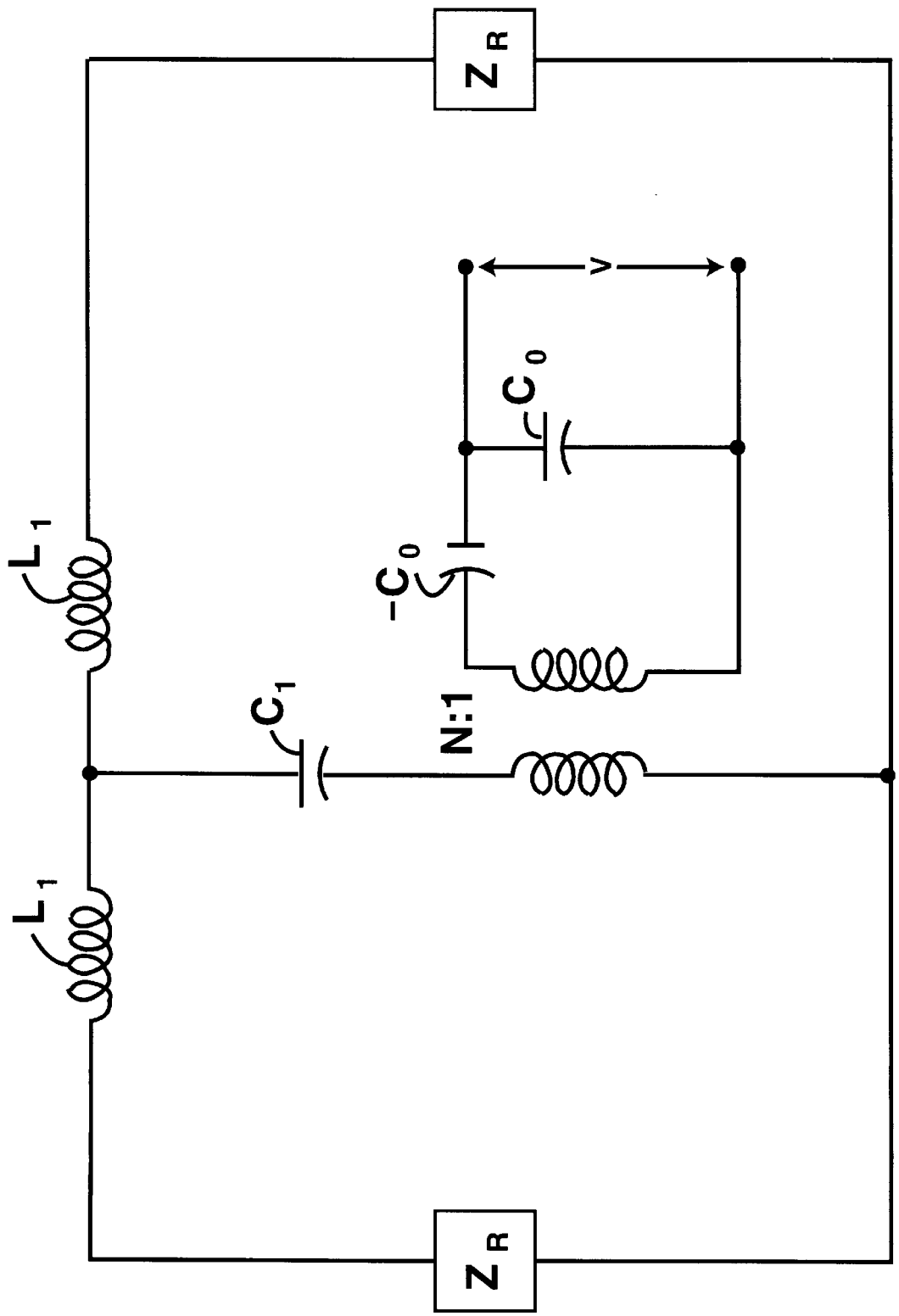
FIG. 1 is an equivalent electric circuit for an underwater acoustic radiator having a thin, square slab of piezoelectric $PVF_2$ as the active element, operated as a thickness expander, with the electric field parallel to the thickness.

It is not necessary to use the complete equivalent circuit (shown in FIG. 1) for the square planar sonar radiator considered here, since only variations in the mechanical or physical characteristics are to be calculated. Thus, the electrical inlet portion of the equivalent circuit can be ignored and only the mechanical portion of the equivalent circuit, shown in FIG. 2, need be considered. In this equivalent circuit, $$L_1 = jA\rho_m c_m \tan\left[\frac{k_m l}{2}\right],$$

$$C_1 = \frac{A\rho_m c_m}{j\sin[k_m l]}, \text{ and}$$

$$Z_R = A\rho c [\theta_0(ka) + J\chi_0(ka)]$$

where:
A=the area of the radiating face(s);
a=$\sqrt{A}$=the length of the side of the square radiator;
l=the thickness of the radiator;
$\rho$=the density of water;
c=the speed of sound in water;
$\omega$=radian frequency;

$$k = \frac{\omega}{c};$$

$E_m$=Young's modulus of the radiator material;
$\rho_m$=the density of the radiator material;
$C_m$=the speed of sound in the radiator material;

$$c_m = \sqrt{\frac{E_m}{\rho_m}};$$

$$k_m = \frac{\omega}{c_m}; \text{ and}$$

$\Theta_0$ and $\chi_0$ are tabulated functions given in Table IX, page 901, of *Theoretical Acoustics*, 1968, Library of Congress Catalog Card No. 67-15428.

Figure 2:
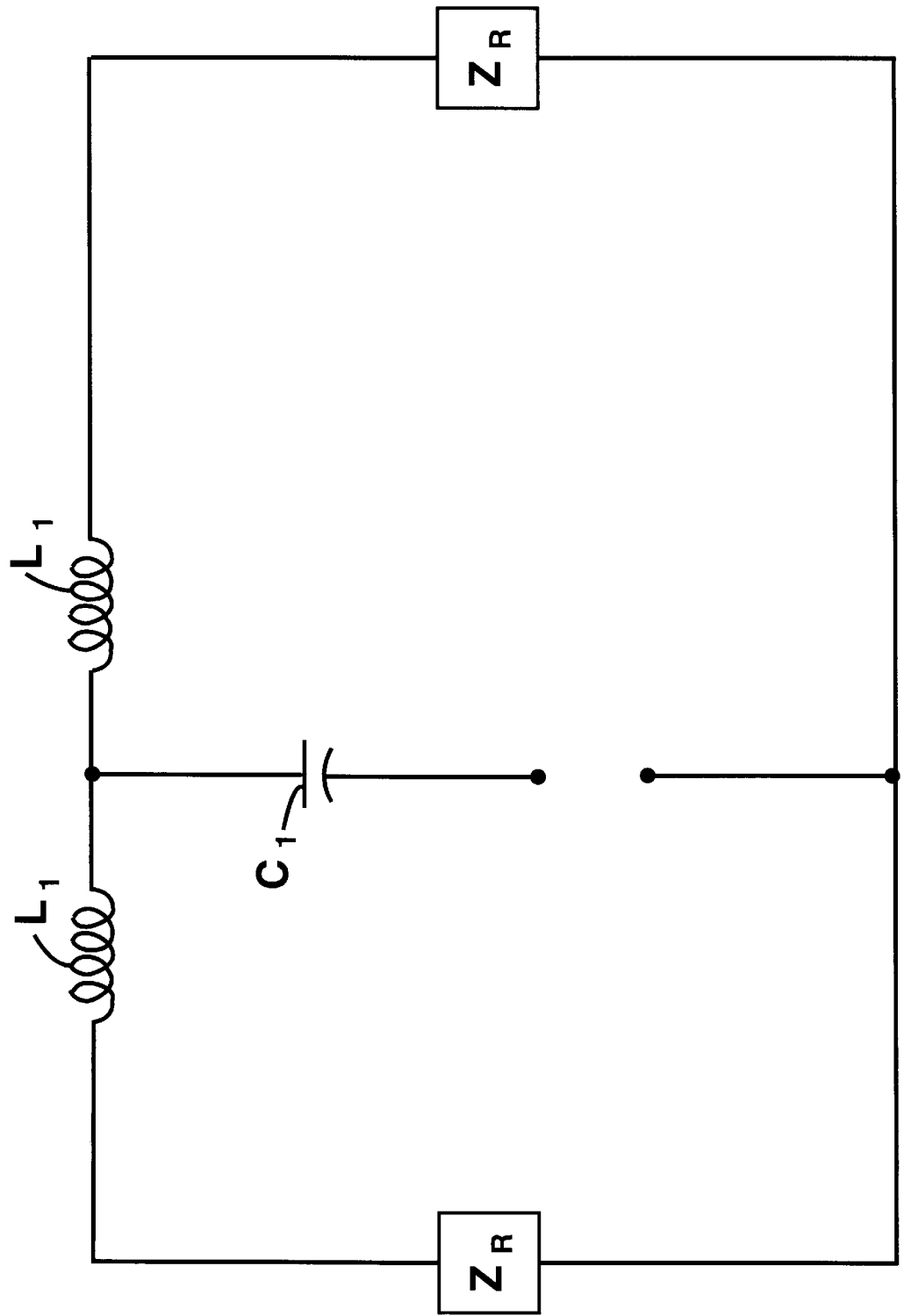
FIG. 2 is the mechanical impedance output portion of the equivalent circuit of FIG. 1.
Figure 3:
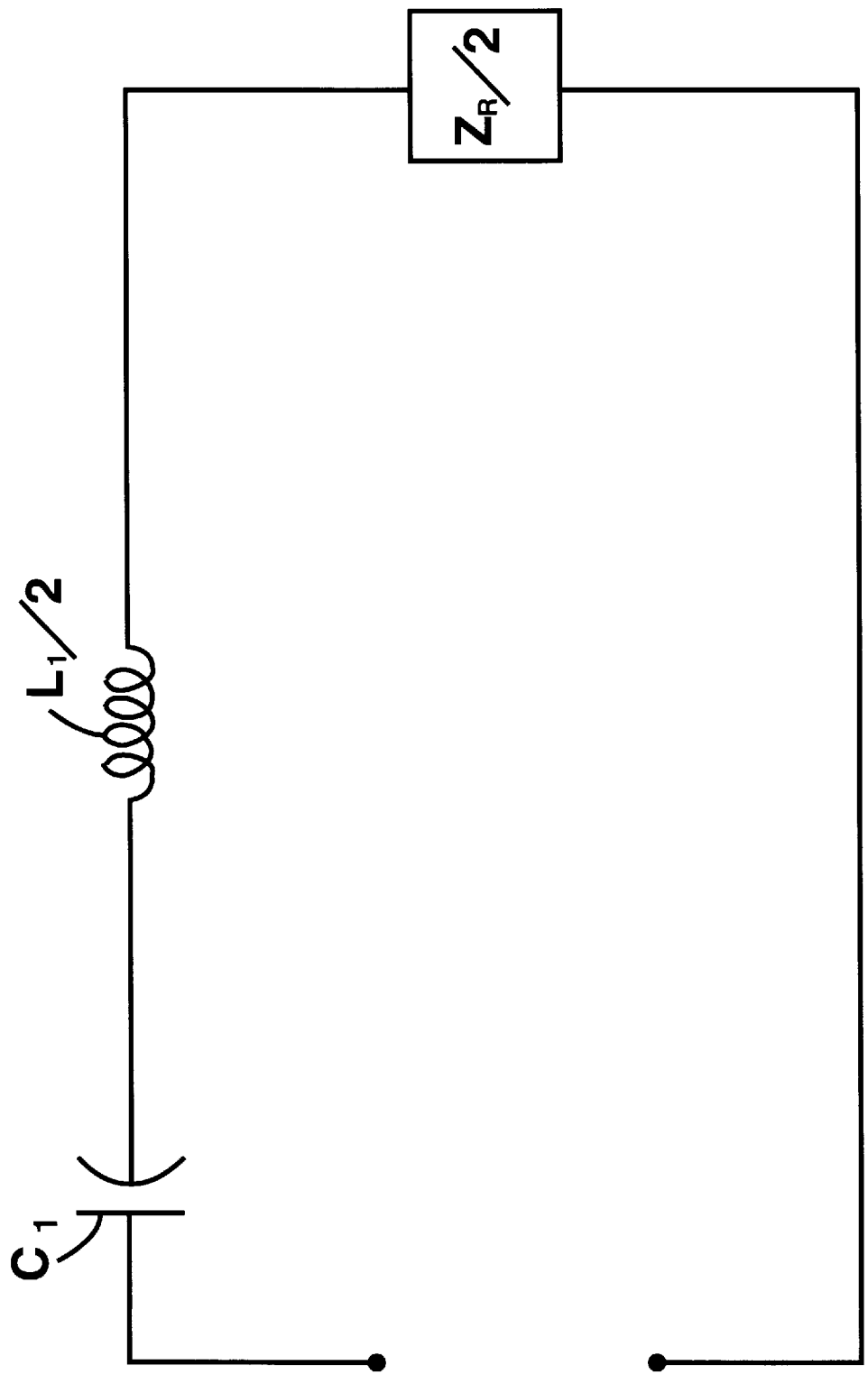
FIG. 3 is a simplification of the circuit of FIG. 2, for the specific case where both faces of active element see the same load.
Figure 4:
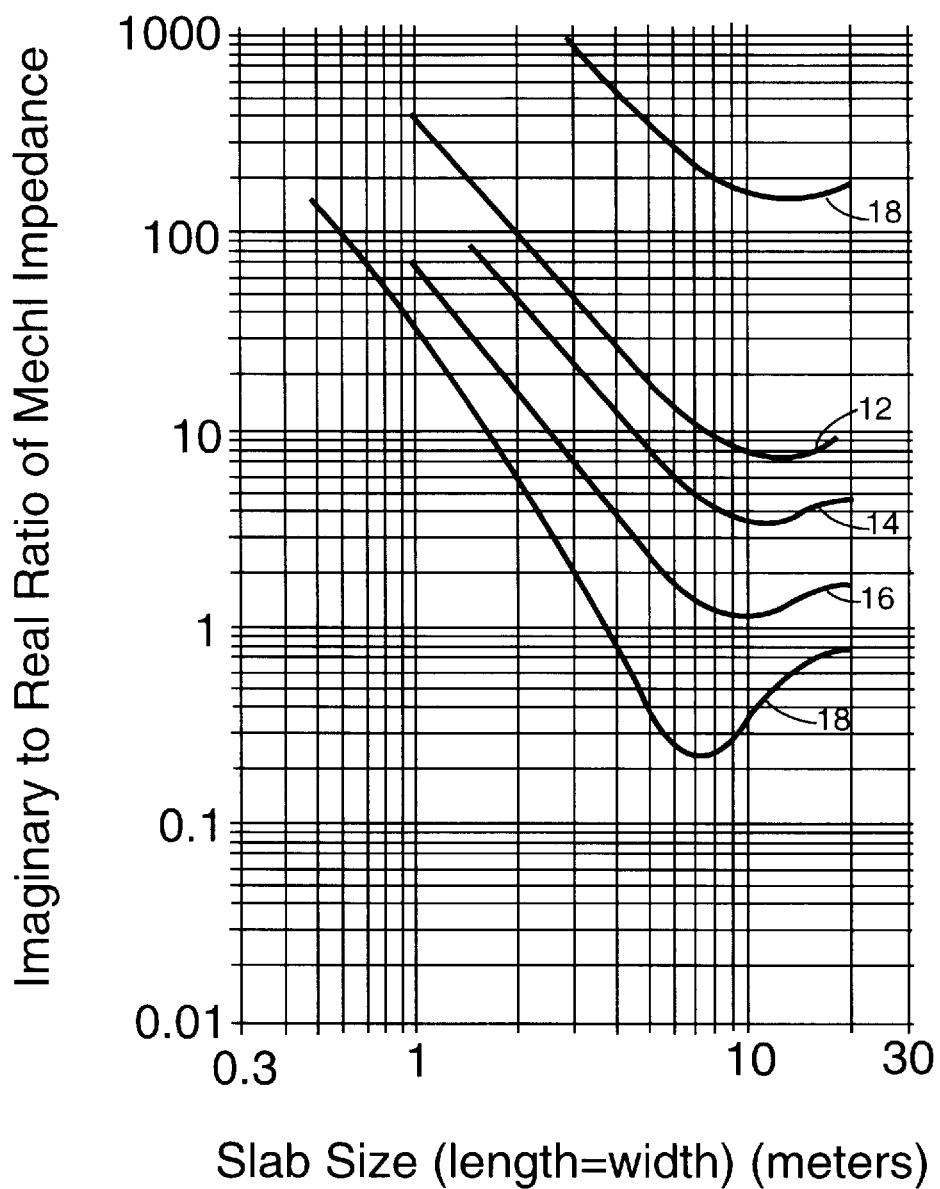
FIG. 4 shows a plot of the ratio $Z_{mi}/Z_{mr}$ of the imaginary portion of the mechanical impedance $Z_{mi}$ to the real portion of the mechanical impedance $Z_{mr}$ versus the slab size a for five values of Young's modulus $E_m$, for the underwater acoustic radiator of FIGS. 1–3 at an acoustic frequency of 100 Hz and a radiator thickness of 2.5 cm.
Figure 5:
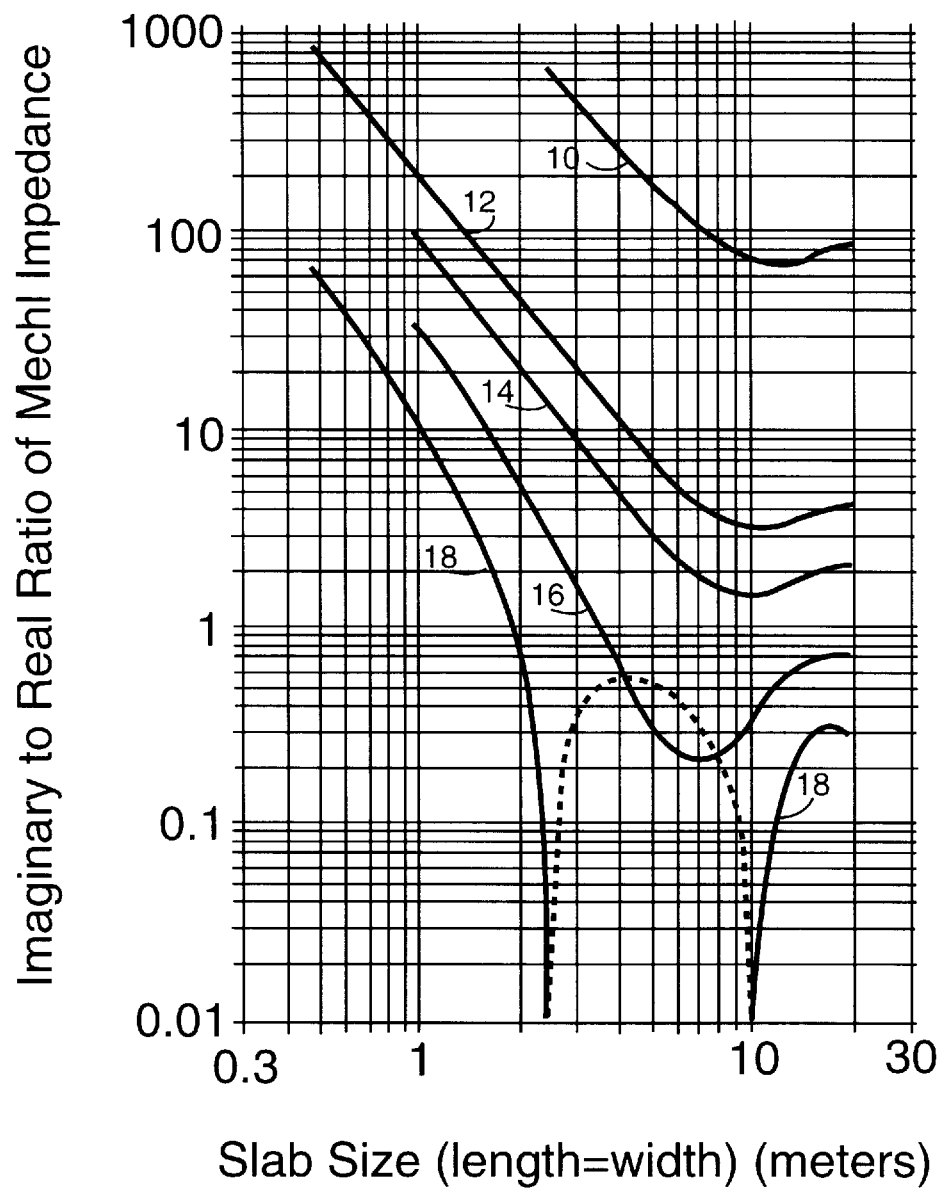
FIG. 5 shows a plot of the ratio $Z_{mi}/Z_{mr}$ of the imaginary portion of the mechanical impedance $Z_{mi}$ to the real portion of the mechanical impedance $Z_{mr}$ versus the slab size a for five values of Young's modulus $E_m$, for the underwater acoustic radiator of FIGS. 1–3 at an acoustic frequency of 100 Hz and a radiator thickness of 5.0 cm.
Figure 6:
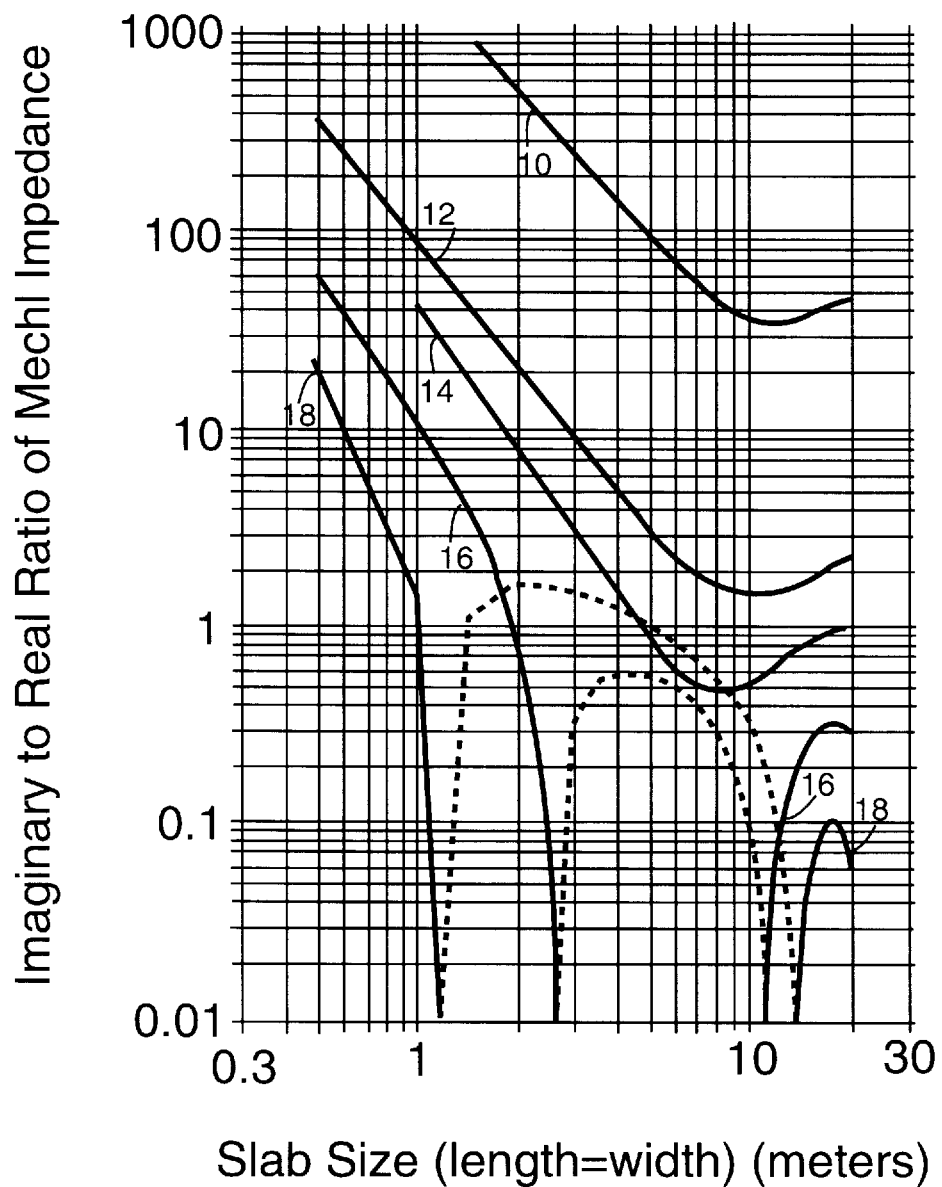
FIG. 6 shows a plot of the ratio $Z_{mi}/Z_{mr}$ of the imaginary portion of the mechanical impedance $Z_{mi}$ to the real portion of the mechanical impedance $Z_{mr}$ versus the slab size a for five values of Young's modulus $E_m$, for the underwater acoustic radiator of FIGS. 1–3 at an acoustic frequency of 100 Hz and a radiator thickness of 10.0 cm.
Figure 7:
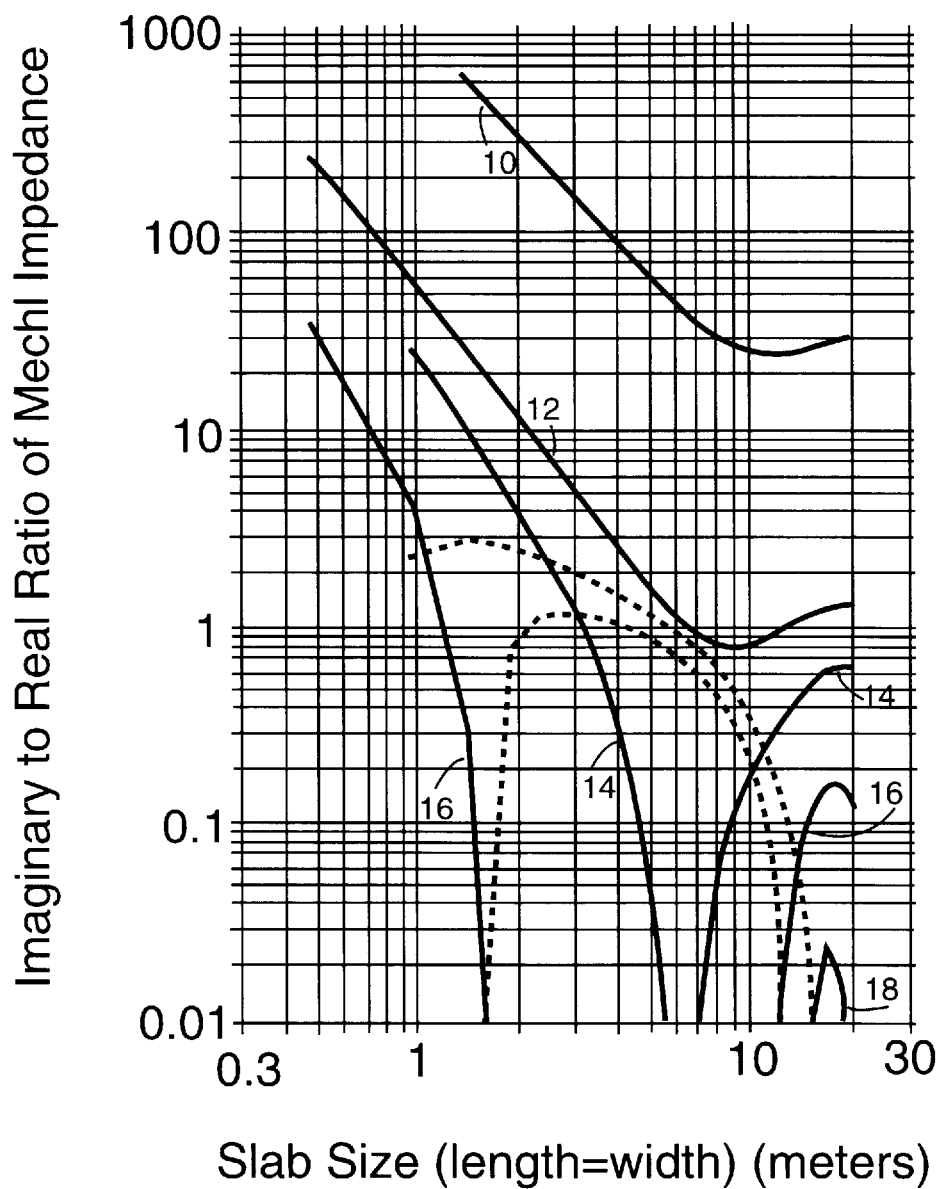
FIG. 7 shows a plot of the ratio $Z_{mi}/Z_{mr}$ of the imaginary portion of the mechanical impedance $Z_{mi}$ to the real portion of the mechanical impedance $Z_{mr}$ versus the slab size a for five values of Young's modulus $E_m$, for the underwater acoustic radiator of FIGS. 1–3 at an acoustic frequency of 100 Hz and a radiator thickness of 15.0 cm.

The circuit of FIG. 2 is needlessly general in that it allows the possibility of each face of the radiator seeing a different impedance. In a sonar application, the two faces will see the same load, and this allows a simplification of the circuit, as shown in FIG. 3, in which the value of capacitance is the same as given previously, while the values of inductance and the load are each one-half the values given previously.

The inductance $L_1/2$ and the capacitance $C_1$ of FIG. 3, can be combined to form an impedance $Z_\Sigma$, as follows:

$$Z_\Sigma = C_1 + L_1/2$$

$$Z_\Sigma = \frac{A\rho_m c_m}{j\sin k_m l} + \frac{jA\rho_m c_m}{2}\tan\left(\frac{k_m l}{2}\right)$$

$$Z_\Sigma = j\frac{A\rho_m c_m}{2}\left[\frac{\sin\left(\frac{k_m l}{2}\right)}{\cos\left(\frac{k_m l}{2}\right)} - \frac{1}{\sin\left(\frac{k_m l}{2}\right)\cos\left(\frac{k_m l}{2}\right)}\right]$$

$$Z_\Sigma = j\frac{A\rho_m c_m}{2}\left[\frac{\sin^2\left(\frac{k_m l}{2}\right) - 1}{\sin\left(\frac{k_m l}{2}\right)\cos\left(\frac{k_m l}{2}\right)}\right]$$

$$Z_\Sigma = j\frac{A\rho_m c_m}{2}\left[\frac{\cos^2\left(\frac{k_m l}{2}\right)}{\sin\left(\frac{k_m l}{2}\right)\cos\left(\frac{k_m l}{2}\right)}\right]$$

$$Z_\Sigma = j\frac{A\rho_m c_m}{2\tan\left(\frac{k_m l}{2}\right)}$$

Finally, the input impedance to the mechanical side, $Z_m$, is the sum of the two impedances $Z_\Sigma$ and $Z_R$.

$$Z_m = \frac{A}{2}\left[\rho c\theta_0\left(\frac{\omega a}{c}\right) + j\rho c\chi_0\left(\frac{\omega a}{c}\right) - \frac{j\rho_m c_m}{\tan\left(\frac{\omega l}{2c_m}\right)}\right]$$

The ratio of the imaginary portion $Z_{mi}$ to the real portion $Z_{mr}$ of the mechanical impedance $Z_m$ is:

$$Z_{mi}/Z_{mr} = \frac{+j\rho c \chi_0 \left(\dfrac{\omega a}{c}\right) - \dfrac{j\rho_m c_m}{\tan\left(\dfrac{\omega l}{2 c_m}\right)}}{\rho c \theta_0 \left(\dfrac{\omega a}{c}\right)}$$

If one wishes to steer an antenna, a "spatial sampling" constraint has to be satisfied, which is that the independent elements of the antenna can be separated by a distance no larger than one-half wavelength. Thus, the allowable size of the elements is bounded above at one-half wavelength. For the 100 Hz choice made here, that number is 7.5 meters. The abscissa values for slab size, in FIGS. 4–7, extend above 7.5 meters, but that has been done only to give as complete a picture as possible of the loci. Similarly, the range of radiator thicknesses, in FIGS. 4–7, exceed those of practical interest. Specifically, a radiator having a thickness of 2.5 cm. (FIG. 4) may be too thin to permit the strains that are a consequence of radiating the power level typical in sonar, and a radiator having a thickness of 15 cm.(FIG. 7) may be too thick to allow drag to be controlled, to permit adequate heat transfer, or to provide a sufficiently low capacitance.

The results are expressed in terms of the ratio of the imaginary to the real part of the mechanical impedance. When the imaginary part is a stiffness, the curves are solid, when it is a mass, they are broken. FIGS. 4–7 each include five curves 10, 12, 14, 16, and 18, corresponding to $PVF_2$ radiators having Young's moduli of $2 \times 10^9$ N/m$^2$, $1 \times 10^8$ N/m$^2$, $5 \times 10^7$ N/m$^2$, $2 \times 10^7$ N/m$^2$, and $1 \times 10^7$ N/m$^2$, respectively.

Satisfactory operation as a radiator requires that the real part of the mechanical impedance be greater than the imaginary part of the mechanical impedance, i. e., in FIGS. 4–7, being below an ordinate value of unity. An examination of the curves in FIGS. 4–7 indicates that the upper limit on Young's modulus at an acoustic frequency of 100 Hz. and a slab size of 7.5 meters is less than $2 \times 10^7$ N/m$^2$ for a slab thickness of 2.5 cm., less than $5 \times 10^7$ N/m$^2$ for a slab thickness of 5 cm., less than $1 \times 10^8$ N/m$^2$ for a slab thickness of 10 cm., and less than $1 \times 10^9$ N/m$^2$ for a slab thickness of 15 cm. Since a slab thickness of 15 cm. is probably not practical, it would appear that the optimum value for a 100 Hz. underwater acoustic radiator will generally fall within the range of $10^7$ N/m$^2$ to $10^8$ N/M$^2$.

To produce electrostrictive polymers having a low modulus, poly(vinylidine fluoride) ($PVF_2$) was plasticized with tricresyl phosphate (TCP), with one group of samples having 40% TCP and a second group of samples having 65% TCP. Tests performed on these samples showed that the plasticized poly(vinylidine fluoride) has exceptional electrostrictive properties measured in a dynamic fashion. These $PVF_2$/TCP polymers and the tests performed on them are described in U.S. patent application Ser. No. 07/627,260. While demonstrating an important effect, the poly (vinylidene fluoride)/tricresyl phosphate material displays at least one major drawback for practical application: plasticizer exudes spontaneously from the solid poly(vinylidene fluoride)/tricresyl phosphate film.

The poly(vinylidene fluoride)/tricresyl phosphate material is a semicrystalline polymer, consisting of a crystalline $PVF_2$ component, an amorphous $PVF_2$ component, and a liquid/amorphous tricresyl phosphate plasticizer component, and it not clear whether the major electrostrictive effect originates in the amorphous phase, the crystalline phase or a combination of these two phases.

Regardless of the phase or phases in which the major electrostrictive effect originates, there is a class of polymers, poly(phosphazenes) $[R_2PN]_n$, which should exhibit electrostrictive properties similar to the poly(vinylidene fluoride)/tricresyl phosphate material but which also is thermally stable to at least 150° C., has no component which will exude from the material, and is highly hydrophobic, making these polymers attractive candidates for use as the active element of an underwater acoustic radiator.

If crystallinity or the presence of an ordered phase is not essential to the electrostrictive phenomenon, poly (phosphazenes) having an amorphous, liquid-like structure can be utilized. If crystallinity or the presence of an ordered phase is essential to the electrostrictive phenomenon, poly (phosphazenes) having a semicrystalline or ordered phase structure can be utilized. Each of these classes of polymers are discussed below.

Amorphous Poly(diorganophosphazenes)

Amorphous poly(diorganophoshaszenes) of the proposed compositions have the following properties which make them attractive as possible low modulus electrostrictive polymers: (1) highly flexible chains which mimic the liquid-like phase in the $PVF_2$/TCP materials; (2) polar groups in the chain (P—N bonds) and the side-groups (P—O bonds) which mimic the polar components of the $PVF_2$/TCP materials; (3) a highly hydrophobic nature; and (4) a structure which tends to exclude ionic impurities, i. e., display extremely low ionic conductivities. Also, unlike $PVF_2$/TCP, polyphosphazenes are thermally stable to 150° C., have moduli controllable by crosslinking, and have no component which will exude from the material.

The specific poly(diorganophosphazenes) which are candidates for this application are the amorphous "mixed alkoxy" phosphazenes which are elastomers at ambient temperature and have very low glass transition temperatures. An example of an amorphous polymer well suited to this application is "EYPEL-F" resin, available from Ethyl Corporation $[(R0)(R'0)PN]_n$, where R–trifluoroethoxy, and R'=a proprietary oligomeric fluoroalkoxy group. This resin also contains some unsaturation which enables cross-linking. It is important to note that the resin is specified here, i.e., polymer without filler or stabilizers. Such additives usually raise the glass transition temperature of the polymer and diminish the electrostrictive effect. Other fluorinated alkoxy and non-fluorinated alkoxy side group combinations could be equally effective or even more effective in this application. Mechanical stability is achieved through cross-linking by use of vinyl groups and free-radical initiators such as dibenzoyl peroxide. Other ways of creating mechanical stability are through radiation and through photochemical methods.

Semicrystalline or Ordered Phase Poly (diorganophosphazenes)

Semicrystalline or ordered phase poly (diorganophosphazenes) have the following properties similar to $PVF_2$/TCP properties which makes them attractive as possible low modulus electrostrictive polymers: (1) highly flexible chains which mimic the liquid-like phase on the $PVF_2$/TCP materials; (2) polar groups in the chain (P—N bonds) and the side-groups (P—O bonds) which mimic the polar components of the $PVF_2$/TCP materials; and (3) controllable crystallinity with a completely amorphous (liquid-like) structure making up the remainder of the polymer, which mimics the morphological features of the $PVF_2$/TCP materials. In addition, the proposed polyphosphazenes have a highly hydrophobic nature, and a structure which tends to exclude ionic impurities, i. e., display extremely low ionic conductivities. Also, unlike $PVF_2/TCP$, polyphosphazenes are thermally stable to 150° C., have moduli controllable by crosslinking, and have no component which will exude from the material.

The specific poly(diorganophosphazenes) which are candidates for this application are the semicrystalline alkoxy phosphazenes which are thermoplastics at ambient temperature and have very low glass transition temperatures. An example of an amorphous polymer well suited to this application is $[(RO)(R'O)PN]_n$, where $R=R'=$ trifluoroethoxy, a semicrystalline polyphosphazene. The best approach to success in mimicking the properties of $PVF_2/TCP$ is to choose side groups which will give a relatively small fraction of crystalline component with a relatively high crystalline melting temperature, and an amorphous phase with a very low glass transition temperature. Thus, it may be necessary to prepare new polymers with structures tailored to produce the desired extent of crystallinity. For example, if the degree of crystallinity in the poly(bis (trifluorethoxy) phosphazene) is too high, one approach to decreasing the crystallinity is to introduce a different R' group. Increasing the proportion of a second alkoxy group (e.g., trifluoropropoxy or other alkoxy group) should decrease the extent of crystallinity while retaining all other desirable properties.

So far, only polymers similar to the semicrystalline $PVF_2/$TCP materials discussed above, i. e., semicrystalline polyphosphazenes which include the presence of an ordered phase, have been synthesized and tested, as discussed below.

Polyphosphazenes which we have utilized are linear polymers which have a general structure $(R'R''P=N)_n$, where R' and R" are usually alkoxide groups (though either or both can be alkyl, aryl, or organometallic groups), P is phosphorus, and N is nitrogen. The degree of polymerization is represented by $_n$, the value for which is such that number average molecular weights above 10,000 amu are achieved.

A number of different sources and methods were utilized to obtain poly(fluoroalkoxy phosphazenes) wherein, with reference to the structure shown above, R' is a fluorinated alkoxide and R" is identical with R'. It was felt that this class of polymers had promise for showing high electrostriction, because polyphosphazenes are known to have amorphous phases with a low glass transition temperatures. Furthermore, the fluoroalkoxy groups contain highly polar bonds and convey high environmental stability on these polymers. Specific polymers in this class were obtained and worked up as described below. In the discussion below poly(bis(trifluoroethoxy)phosphazene), $[(F_3CCH_2O)_2P=N]_n$, is given the acronym PBTFP.

EXAMPLE 1

PBTFP was prepared by the method of Allcock (H. R. Allcock, R. L. Kugel and K. J. Valan, *Inorg. Chem.,* Vol. 5, 1966, page 1709). The sample was repeatedly reprecipitated by pouring a methyl ethyl ketone (MEK) solution into water to remove ionic impurities. In a dust-free room, very slow evaporation of MEK (freshly distilled) solutions of this polymer on Teflon (PTFE) shim stock or on mercury produced excellent non-tacky 1–2 mil films, which were tested and evaluated in conventional manner.

Figure 8:
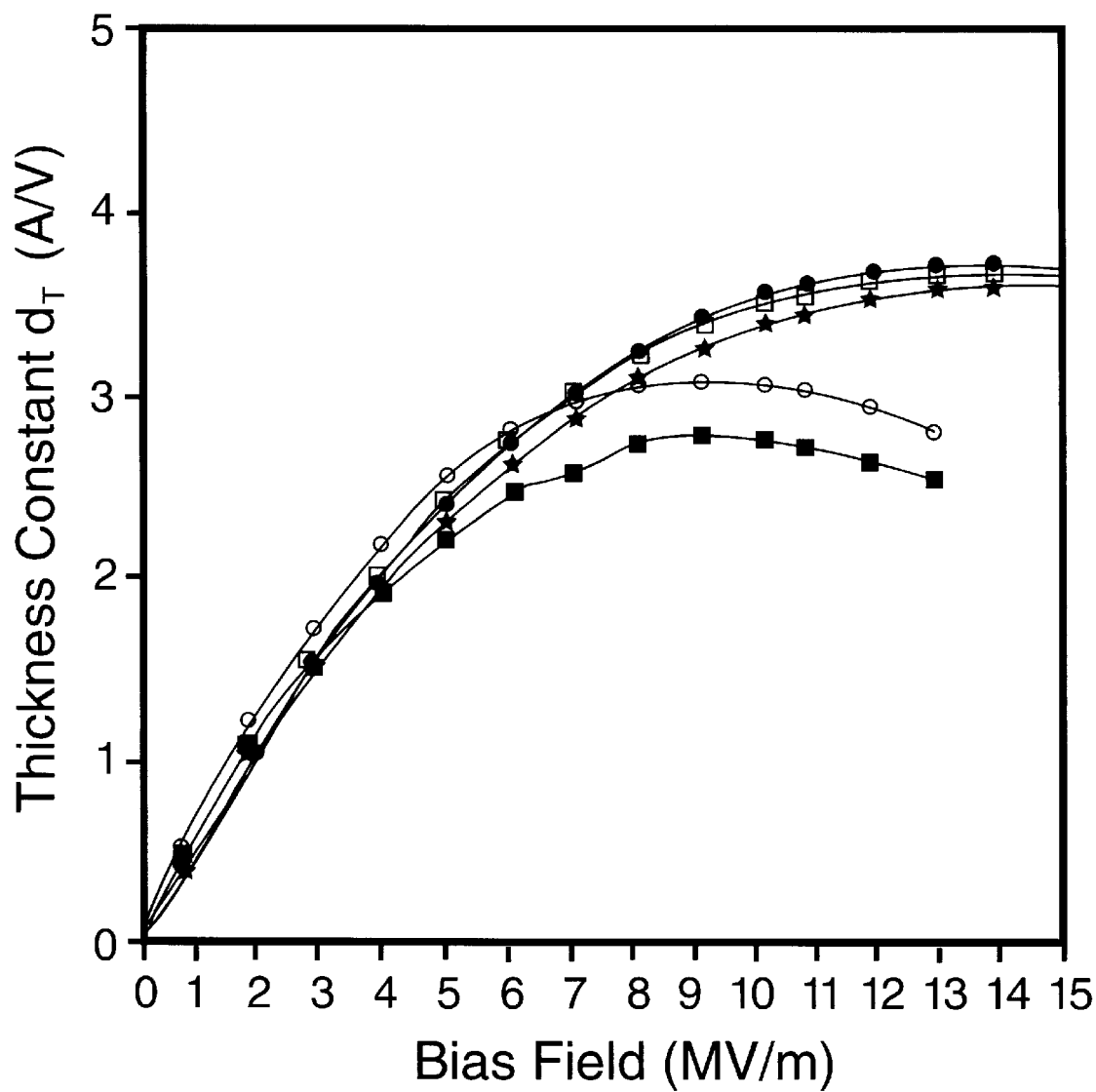
FIG. 8 is a plot of the electrostrictive constant, in Ångstroms per volt (Å/V), versus the DC bias field, in megavolts per meter (MV/m), for five samples of polyphosphazene film described below as Example 1.

FIG. 8 shows a plot of the electrostrictive (or apparent piezoelectric) constant in Ångströms per volt (Å/V) versus the applied DC bias field in megavolts per meter (MV/m) for five test samples of these films. It is seen from these data that at high applied fields, electrostrictive constants of 3–4 Å/V are obtained, which is equal or higher than the equivalent piezoelectric constants of the ceramic piezoelectric materials presently used as the active element of underwater acoustic radiators. The dielectric constant of this PBTFP material was 6. The Young's modulus of this PBTFP film was $3.28 \times 10^8$ N/m, more than two orders of magnitude less than that of ceramic piezoelectric materials, such as lead zirconate-lead titanate which typically have a modulus of about $12 \times 10^{10}$ N/m². Because of this combination of high electrostrictive constant and low modulus, this polyphosphazene material is expected to perform better as the active element in underwater acoustic radiators than the piezoelectric ceramic materials used in the past. Also, although the Young's modulus of this polyphosphazene material is somewhat higher that the optimum value range calculated for a 100 Hz radiator above ($10^7$ N/m² to $10^8$ N/m²), it should still be an excellent active material for an active sonar radiator having an acoustic frequency less than 1 KHz but greater than 100 Hz.

Figure 9:
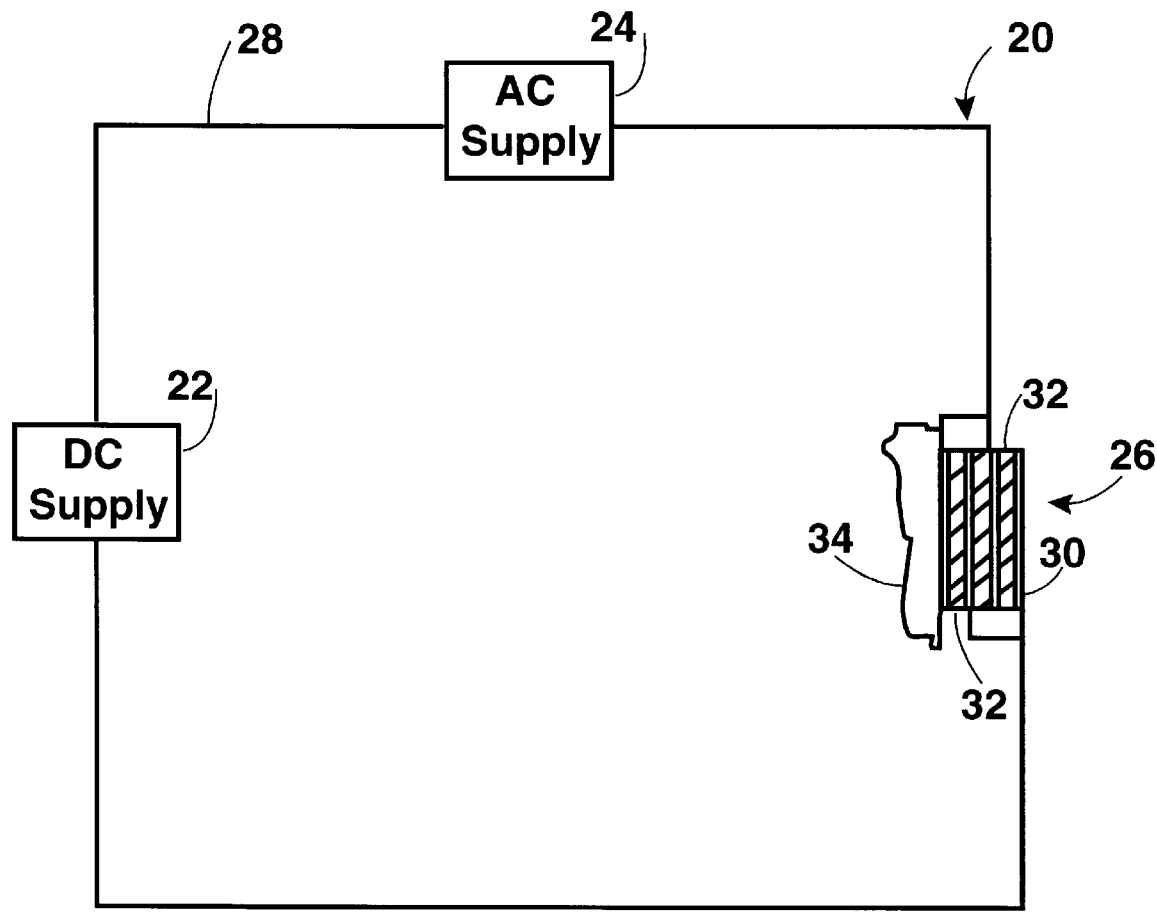
FIG. 9 is a schematic representation of an underwater acoustic radiator, according to the invention.

Referring now to FIG. 9, an underwater acoustic projector system 20 includes a DC bias voltage power supply 22, an AC power supply 24, and an acoustic signal radiator 26 which are connected electrically in series by a circuit 28. The acoustic signal radiator 26 has a plurality of electrodes 30 and layers 32 of polymer material which are in intimate contact with each other in alternating manner. Every other electrode 30 is connected to the AC power supply 24 and the remaining electrodes 30 are connected to the DC bias voltage power supply 22 so that the layers 32 are electrically connected in parallel by the circuit 28 and electrodes 30, a well known arrangement which is shown in U.S. Pat. No. 4,257,686 to Albertinetti et al. The combination of electrodes 30 and layers 32 are attached to a support 34.

The polymer material of the layers 32 is one of the poly(phosphazenes) described above.

The electrodes 30 can be made of any suitable conductive material. For example, conductive metals such as gold, silver, copper or aluminum can be evaporated and deposited on the polymer layers 32. If the electrodes 30 are formed of a metallic material, the thickness of the electrodes 30 must be small relative to the thickness of the polymer layers 32 so that Young's modulus for the combination of electrodes 30 and layers 32 is not greatly increased.

The number, shape and dimensions of the electrodes 30 and polymer layers 32 depend upon such factors as the magnitude and frequency of the desired acoustic signal to be radiated, and can be readily determined by those skilled in the art. Generally, the number of electrodes 30 will be one more than the number of polymer layers 32. For example, a combination of two electrodes 30 and one polymer layer 32 disposed between the two electrodes 30 can be used in one application, and a combination of 11 electrodes 30 and 10 polymer layers 32 in a different application.

Also, the DC and AC power supplies 22, 24, and circuit 28 are well known items which can be easily selected by one skilled in the art.

Since there are many modifications, additions, or changes to the specific embodiments described herein which would be obvious to one skilled in the art, it is intended that the scope of the invention be only limited by the appended claims.

What is claimed and desired to be secured by Letters Patent of the United States is:

1. An acoustic radiator which comprises:
   at least one layer of a highly hydrophobic polymer material having a phase with a very low glass transition temperature, said polymer material having a Young's modulus less than $4 \times 10^8$ Newtons per square meter, an electrostrictive response under high DC bias greater than 3 Ångströms per volt, and a dielectric constant less than 10;

biasing means for applying a high dc bias voltage across said at least one layer of polymer material; and means for superimposing a low frequency AC signal on the DC bias voltage;

wherein said polymer material is a linear poly(diorganophosphazene) having a general structure $(R'R''P=N)_n$, where:

R' is selected from a group consisting of alkoxy, alkyl, aryl, or organometallic groups;

R'' is selected from a group consisting of alkoxy, alkyl, aryl, or organometallic groups;

P is phosphorus;

N is nitrogen; and n represents the degree of polymerization.

2. An acoustic radiator, as described in claim 1, wherein said radiator is an underwater acoustic radiator of a sonar system.

3. An acoustic radiator, as described in claim 1, wherein said polymer material is poly(bis(trifluoroethoxy)phosphazene), $[(F_3CCH_2O)_2P=N]_n$.

\* \* \* \* \*